(12) United States Patent
Rajski et al.

(10) Patent No.: US 8,726,113 B2
(45) Date of Patent: May 13, 2014

(54) SELECTIVE PER-CYCLE MASKING OF SCAN CHAINS FOR SYSTEM LEVEL TEST

(75) Inventors: Janusz Rajski, West Linn, OR (US); Dariusz Czysz, Wielkopolski (PL); Grzegorz Mrugalski, Strzalkowo (PL); Nilanjan Mukherjee, Wisonville, OR (US); Jerzy Tyszer, Poznan (PL)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/453,929

(22) Filed: Apr. 23, 2012

(65) Prior Publication Data

US 2012/0210181 A1    Aug. 16, 2012

Related U.S. Application Data

(63) Continuation of application No. 12/341,996, filed on Dec. 22, 2008, now Pat. No. 8,166,359.

(60) Provisional application No. 61/015,663, filed on Dec. 20, 2007.

(51) Int. Cl.
*G01R 31/28* (2006.01)

(52) U.S. Cl.
USPC ........... 714/732; 714/729; 714/728; 716/106; 716/136

(58) Field of Classification Search
USPC ......... 714/726, 727, 728, 729, 731, 732, 733, 714/741; 716/106, 136
See application file for complete search history.

(56) References Cited

U.S. PATENT DOCUMENTS

| | | | |
|---|---|---|---|
| 5,694,402 A | 12/1997 | Butler et al. | |
| 5,831,992 A | 11/1998 | Wu | |
| 6,353,842 B1 | 3/2002 | Rajski et al. | |
| 6,557,129 B1 | 4/2003 | Rajski et al. | |
| 6,745,359 B2 | 6/2004 | Nadeau-Dostie | |
| 6,829,740 B2 | 12/2004 | Rajski et al. | |
| 7,500,163 B2 | 3/2009 | Rajski et al. | |
| 7,797,603 B2 | 9/2010 | Rajski et al. | |
| 7,805,649 B2 | 9/2010 | Rajski et al. | |
| 7,818,644 B2 | 10/2010 | Rajski et al. | |
| 7,877,656 B2 | 1/2011 | Rajski et al. | |
| 8,166,359 B2 | 4/2012 | Rajski et al. | |
| 8,335,953 B2 * | 12/2012 | Whetsel | 714/727 |
| 8,347,159 B2 * | 1/2013 | Mrugalski et al. | 714/738 |
| 2004/0133831 A1 | 7/2004 | Williams et al. | |

(Continued)

OTHER PUBLICATIONS

"Method for Masking Unpredictable Shift Register Latch States During Random Pattern Self-Test" IBM Technical Disclosure Bulletin (TDB v36 n2 Feb. 1993 p. 239-242) Publication Date: Feb. 1, 1993.*

(Continued)

*Primary Examiner* — Cynthia Britt
(74) *Attorney, Agent, or Firm* — Klarquist Sparkman, LLP

(57) ABSTRACT

Built-in self-test techniques for integrated circuits that address the issue of unknown states. Some implementations use a specialized scan chain selector coupled to a time compactor. The presence of the specialized scan chain selector increases the efficiency in masking X states. Also disclosed are: (1) an architecture of a selector that works with multiple scan chains and time compactors, (2) a method for determining and encoding per cycle scan chain selection masks used subsequently to suppress X states, and (3) a method to handle an over-masking phenomenon.

25 Claims, 3 Drawing Sheets

(56) References Cited

U.S. PATENT DOCUMENTS

| | | |
|---|---|---|
| 2004/0139377 A1 | 7/2004 | Barnhart et al. |
| 2005/0240848 A1 | 10/2005 | Cote et al. |
| 2008/0052578 A1 | 2/2008 | Rajski et al. |
| 2008/0052586 A1 | 2/2008 | Rajski et al. |
| 2010/0138708 A1 | 6/2010 | Rajski et al. |
| 2010/0306609 A1 | 12/2010 | Rajski et al. |
| 2012/0239995 A1* | 9/2012 | Gizdarski ............... 714/729 |

OTHER PUBLICATIONS

Barnhart, et al., "OPMISR: The foundation for compressed ATPG vectors," *Proc. of IEEE Int'l Test Conf. (ITC)*, pp. 748-757 (2001).

Barnhart, et al., "Extending OPMISR beyond 10x scan test efficiency," IEEE *Design and Test of Computers*, vol. 19, No. 5, pp. 65-73 (2002).

Chickermane et al., "Channel masking synthesis for efficient on-chip test compression," *Proc. of IEEE Int'l Test Conf. (ITC)*, pp. 452-461 (2004).

Clouqueur et al., "Design and analysis of multiple-weight linear compactors of responses containing unknown values," *Proc. of IEEE Int'l Test Conf. (ITC)*, pp. 1099-1108 (2005).

Garg et al., "Increasing output compaction in presence of unknowns using an X-canceling MISR with deterministic observation," *26th IEEE VLSI Test Symposium*, pp. 35-42 (2008).

Leininger et al., "Using timing flexibility of automatic test equipment to complement X-tolerant test compression techniques," *Proc. of IEEE Int'l Test Conf. (ITC)*, paper 6.3 (2007).

Mitra et al., "X-Compact: an efficient response compaction technique," *IEEE Transactions on Computer-Aided Design of Integrated Circuits and Systems*, vol. 23, pp. 421-432 (Mar. 2004).

Mitra et al., "X-tolerant signature analysis," *Proc. of IEEE Int'l Test Conf. (ITC)*, pp. 432-441 (2004).

Mrugalski et al., "Highly X-Tolerant Selective Compaction of Test Responses," *27th IEEE VLSI Test Symposium*, pp. 245-250 (2009).

Mrugalski et al., "Ring Generators—New Devices for Embedded Test Applications," *IEEE Transactions on Computer-Aided Design of Integrated Circuits and Systems*, vol. 23, No. 9, pp. 1306-1320 (Sep. 2004).

Mrugalksi et al., "New Test Data Decompressor for Low Power Applications," *Proceedings of the 44th Annual Design Automation Conference (DAC)*, pp. 539-544 (2007).

Naruse et al., "On-chip compression of output responses with unknown values using LFSR reseeding," *Proc. of IEEE Int'l Test Conf. (ITC)*, pp. 1060-1068 (2003).

Patel et al., "Application of Saluja-Karpovsky compactors to test responses with many unknowns," *21st IEEE VLSI Test Symposium*, pp. 107-112 (2003).

Pomeranz et al., "On output response compression in the presence of unknown output values," *Proceedings of the 39th Annual Design Automation Conference (DAC)*, pp. 255-258 (2002).

Rajski et al., "Convolutional compaction of test responses," *Proc. of IEEE Int'l Test Conf. (ITC)*, pp. 745-754, (2003).

Rajski et al., "Embedded deterministic test," *IEEE Transactions on Computer-Aided Design of Integrated Circuits and Systems*, vol. 23, pp. 776-792 (May 2004).

Rajski et al., "Embedded deterministic test for low cost manufacturing test," *Proc. of IEEE Int'l Test Conf. (ITC)*, pp. 301-310 (2002).

Rajski et al., "Finite Memory Test Response Compactors for Embedded Test Applications," *IEEE Transactions on Computer-Aided Design of Integrated Circuits and Systems*, vol. 24, pp. 622-634 (2005).

Rajski et al., "Modular compactor of test responses," *26th IEEE VLSI Test Symposium*, pp. 242-251 (2006).

Rajski, et al., "X-Press compactor for 1000x reduction of test data," *Proc. of IEEE Int'l Test Conf. (ITC)*, paper 18.1 (2006).

Sharma et al., "X-Filter: Filtering unknowns from compacted test responses," *Proc. of IEEE Int'l Test Conf. (ITC)*, pp. 1090-1098 (2005).

Tang et al., "On efficient X-handling using a selective compaction scheme to achieve high test response compaction ratios," *Proc. 18th Int'l Conf. on VLSI Design*, pp. 59-64 (2005).

Tang et al., "X-masking during logic BIST and its impact on defect coverage," *Proc. of IEEE Int'l Test Conf. (ITC)*, pp. 442-451 (2003).

Touba, "X-cancelling MISR—an X-tolerant methodology for compacting output responses with unknowns using a MISR," *Proc. of IEEE Int'l Test Conf. (ITC)*, paper 6.2 (2007).

Volkerink et al., "Response compaction with any number of unknowns using a new LFSR architecture," *Proceedings of the 39th Annual Design Automation Conference (DAC)*, pp. 117-122 (2005).

Wang, et al., "On compacting test responses data containing unknown values," *Proc. Int'l Conf. on Computer-Aided Design (ICCAD)*, pp. 855-862 (2003).

Wang et al., "Unknown blocking scheme for low control data volume and high observability," *Proc. of the Conf. on Design, Automation and Test in Europe (DATE)*, pp. 1-6 (2007).

Wang et al., "X-Block: An efficient LFSR reseeding-based method to block unknowns for temporal compactors," *IEEE Trans. on Computers*, vol. 57, pp. 978-989 (Jul. 2008).

Wohl et al., "Fully X-tolerant combinational scan compression," *Proc. of IEEE Int'l Test Conf. (ITC)*, paper 6.1 (2007).

Wohl, P.; Walcukauski, J.A.; Ramnath, S.;, "Fully X-tolerant combination scan compression," Test Conference, 2007, ITC 2007, IEEE International, vol., No., pp. 1-10, Oct. 21-26, 2007.

Wohl et al., "X-tolerant compression and application of scan-ATPG patterns in a BIST architecture," *Proc. of IEEE Int'l Test Conf. (ITC)*, pp. 727-736 (2003).

\* cited by examiner

SELECTIVE PER-CYCLE MASKING OF SCAN CHAINS FOR SYSTEM LEVEL TEST

RELATED APPLICATIONS

This application is a continuation of U.S. patent application Ser. No. 12/341,996, entitled "Selective Per-Cycle Masking Of Scan Chains For System Level Test," filed Dec. 22, 2008 (now U.S. Pat. No. 8,166,359), which claims the benefit of U.S. Provisional Patent Application No. 61/015,663, entitled "Selective Per-Cycle Masking Of Scan Chains For System Level Test," filed on Dec. 20, 2007, and naming Janusz Rajski et al. as inventors, all of which are hereby incorporated by reference as if set forth in full in this application for all purposes.

FIELD OF THE INVENTION

The present invention is directed to the masking of unknown states during the built-in self-test of integrated circuits. Various embodiments of the invention may be particularly useful for the masking unknown states for built-in self-test techniques using compaction.

BACKGROUND OF THE INVENTION

Time compactors of test responses have always had problems dealing with unknown states. Even state of the art compactors do not tolerate unknown states ("X"s or "x-states") to a high enough standard for today's needs. For example, in BIST applications, a pattern with thousands of scan cells may contain hundreds of scan cells with X states in them, and thus a time compactor may need to handle millions of unknowns.

BRIEF SUMMARY OF THE INVENTION

Aspects of the invention relate to built-in self-test techniques for integrated circuit that address the issue of unknown states. For example, some of the disclosed embodiments use a specialized scan chain selector coupled to a time compactor. The presence of the specialized scan chain selector increases the efficiency in masking X states. Several experimental results confirm that embodiments of the disclosed X-masking scheme do not compromise test quality, but preserve all capabilities of conventional scan-based test and require a small amount of information to control the compactor.

Furthermore, in some of the disclosed embodiments, the scan chain selection scheme has the ability to perform selective masking of scan chains and to handle a wide range of unknown state profiles (for example, the selective masking can be performed such that all such states can be eliminated in a per-cycle mode while preserving high observability of scan cells that capture errors). Also among the disclosed embodiments are: (1) an architecture of a selector that works with multiple scan chains and time compactors, (2) a method for determining and encoding per cycle scan chain selection masks used subsequently to suppress X states, and (3) a method to handle an over-masking phenomenon.

DETAILED DESCRIPTION OF THE INVENTION

Overview

Figure 1:
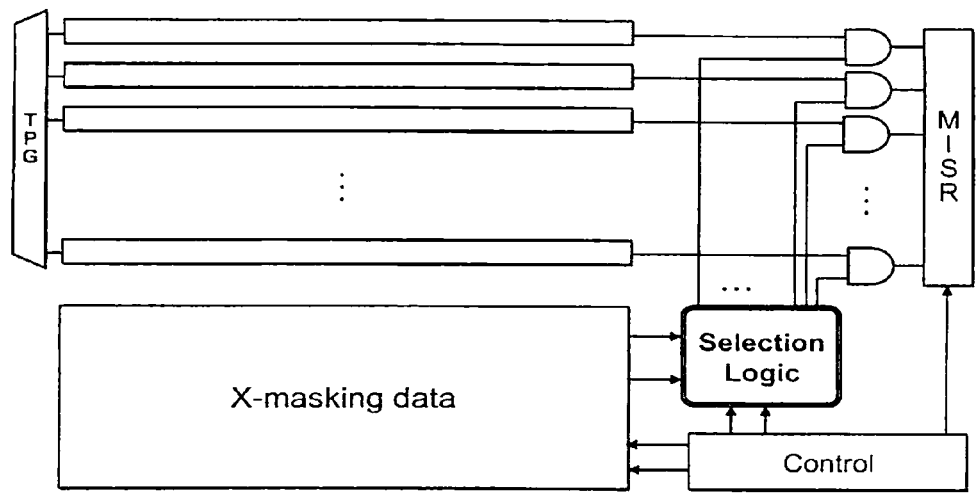
FIG. 1 illustrates an example of an X-masking scheme that may be implemented according to various examples of the invention.

Disclosed below are methods, apparatus, and systems that should not be construed as limiting in any way. Instead, the present disclosure is directed toward all novel and nonobvious features and aspects of the various disclosed methods, apparatus, systems, and equivalents thereof, alone and in various combinations and subcombinations with one another. The present disclosure is not limited to any specific aspect or feature, or combination thereof, nor do the disclosed methods, apparatus, and systems require that any one or more specific advantages be present or problems be solved.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the figures may not show the various ways in which the disclosed methods, apparatus, and systems can be used in conjunction with other methods, apparatus, and systems. Additionally, the description sometimes uses terms like "evaluate" and "determine" to describe the disclosed methods. These terms are high-level abstractions of the actual operations that are performed. The actual operations that correspond to these terms may vary depending on the particular implementation and are readily discernible by one of ordinary skill in the art.

The disclosed embodiments can be used to compress test responses during the testing of a wide variety of scan-based or partially-scan-based circuits (for example, application-specific integrated circuits ("ASICs") (including mixed-signal ASICs), systems-on-a-chip ("SoCs"), or programmable logic devices ("PLDs"), such as field programmable gate arrays ("FPGAs")). The disclosed compression hardware can also be implemented in any such circuits.

Any of the disclosed techniques can be implemented in whole or in part by software comprising computer-executable instructions stored on computer-readable media (e.g., computer-readable media, such as one or more CDs, volatile memory components (such as DRAM or SRAM), or nonvolatile memory components (such as hard drives)). Such software can comprise, for example, electronic design automation ("EDA") software tools (e.g., an automatic test pattern generation ("ATPG") tool). The particular software tools described should not be construed as limiting in any way, however, as the principles disclosed herein are generally applicable to other software tools.

Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Further, any data produced from any of the disclosed methods (e.g., intermediate data or final data resulting from some of the disclosed embodiments) can be created, updated, or stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created or updated at a local computer or over a network (e.g., by a server computer).

Any of the disclosed methods can also be performed in a computer simulation or other EDA environment (e.g., in a simulation environment where test patterns are simulated as being applied to representations of circuits or test responses are simulated as being compressed). For example, the disclosed methods can be performed using circuit design information representative of a circuit-under-test and the associated compression hardware (for example, a netlist, HDL file (such as a Verilog or VHDL file), and the like) and stored on computer-readable media. For presentation purposes, however, the present disclosure sometimes refers to the circuit-under-test (including the various components of the circuit-under-test) and the associated compression hardware (including the various components of the hardware) by their physical counterparts (for example, scan chains, scan cells, ring generator, phase shifter, shadow register, and other such terms). It should be understood, however, that any such reference not only includes the physical components but also includes representations of such components as are used in simulation, automatic test pattern generation, or other such EDA environments.

Any of the disclosed apparatus can be described or represented as design data or design information stored on one or more computer-readable media. For example, any of the disclosed compressors or associated selection hardware can be described or represented in an HDL file (such as a Verilog, VHDL, or register-transfer level file), a gate-level netlist, or other such EDA design file (e.g., a GDSII file or Oasis file).

Introduction

With the design paradigm shifting towards extensive use of embedded cores containing complex and diverse components, next generation test technology will likely experience increasing demands for high quality system level test.

A system level test methodology desirably is capable of one or more of the following:
delivering high quality test patterns going beyond pseudo-random vectors and test points,
accommodating various types of test patterns,
handling unknown (X) states (e.g., resulting from multi-cycle and false paths as well as uninitialized memories) in such a way that the X states (desirably, all X states) are suppressed, and
working as a hybrid solution, so that it can use on-chip test features for both manufacturing and system test to achieve even order of magnitude higher compression ratios in the field.

As designs grow in size, it becomes increasingly expensive to maintain a high level of test coverage. This is due in part to a prohibitively large volume of test data that must be stored, and very long test application times. Accordingly, test methods that reduce the amount of test data can be useful in maintaining the high efficiency of a testing scheme. Test response compaction, in conjunction with stimuli compression, can be used to address the issue of test data volume growth. Unfortunately, in many scan-based designs, X states, once captured in scan cells, are subsequently injected into a compactor, where they can severely affect a signature. This issue applies primarily to time compactors, which allow X states to quickly multiply (due to a feedback fan-out) and sustain their presence until a read out operation. For example, if a test pattern with 100,000 scan cells features typically 100 scan cells with X states, i.e., an X fill rate is equal to 0.1%, and there are 100,000 of such patterns, then a time compactor would have to handle a large volume of roughly $10^7$ unknown states. Consequently, some of the desirable features of a reliable system level test response compactor include preserving observability of any scan cell for a wide range of X state profiles while maintaining high compaction ratios, providing the ability to detect a variety of failures, and assuring design simplicity.

Selector Architecture

FIG. 1 shows an exemplary X-masking scheme according to the disclosed technology. The exemplary X-masking scheme is placed in a system level BIST environment with multiple scan chains. Test stimuli are provided by a test pattern generator (TPG). In one embodiment, the test response compactor comprises a multiple input signature register (MISR) and a scan chain selector, which in turn comprises a mask memory and selection logic driven by mask bits kept, in a compressed form, in the memory. It should be understood that the other types of time compactors can also be used (e.g., other linear feedback shift register (LFSR) or linear finite state machine (LFSM) based compactors). In the illustrated embodiment, the selector outputs gating signals to AND gates (as shown in FIG. 1) in a per-cycle mode such that unknown states originating at various scan cells do not reach a compactor (MISR). These signals either block the corresponding scan chains to suppress X's, or allow scan chains to feed the compactor if they carry errors. Scan chains whose content during a given time frame is not regarded critical may receive either 0 or 1 as their gating signals. This applies primarily to scan cells that do not capture any erroneous signals (but not X's—these states are desirably eliminated in their entirety as otherwise they can corrupt the signature produced by a compactor).

Very often many test responses feature identical or similar patterns of X states (for further details see Section 3). This makes it possible to reduce the amount of on-chip X-masking data by having a small selector which applies the same mask data to multiple patterns. Accordingly, data stored in the mask memory can be re-used many times for various test responses. According to one embodiment, to operate the selection logic, the sequential part of the selection logic is reset after every unload.

Figure 2:
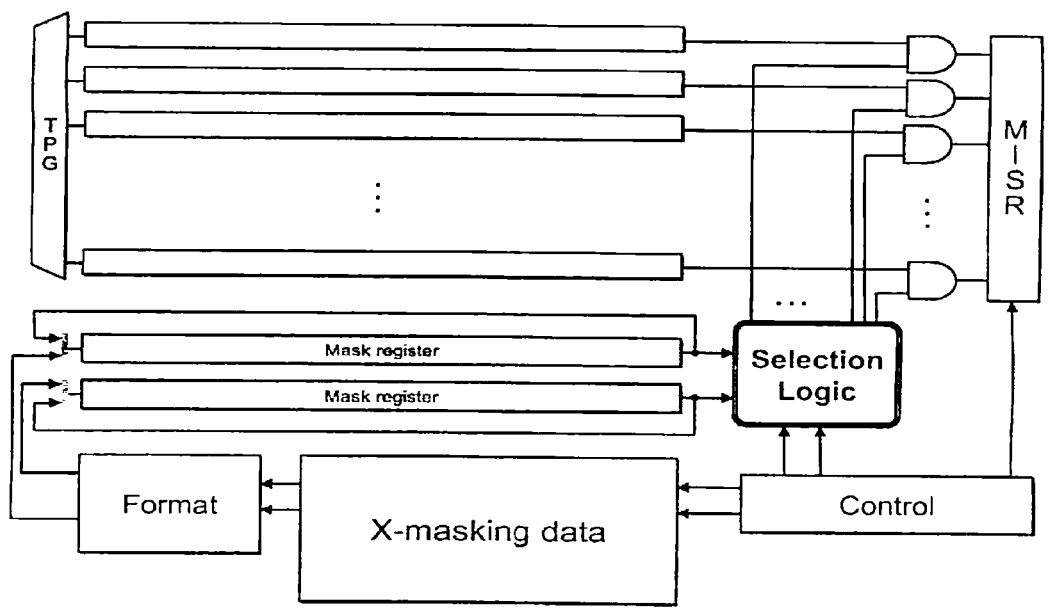
FIG. 2 illustrates another example of an X-masking scheme that may be implemented according to various examples of the invention.

Another embodiment of X-masking circuitry is shown in FIG. 2. The embodiment illustrated in FIG. 2 includes a group of circular mask registers placed between the mask storage and selection logic. This architecture can be used if the mask memory organization is not directly suitable for driving selection logic (e.g., it cannot operate as a group of single-bit-wide memories). In such a case, test data can be reformatted into appropriate streams of bits through the use of an extra device, such as a parallel-to-serial converter. After that, these bits move further to the mask registers, which, in turn, are capable of re-circulating the same data as many times as needed.

One component of both of the exemplary embodiments introduced above is the selection logic that yields the gating signals. Before presenting the architectural details of the selection logic, a discussion is provided in which the typical patterns that produce X states and that the selector has to handle are discussed.

Many test responses that will be passed to the compactor may have identical or similar patterns of X states. Moreover, effects caused by various faults often propagate to the same scan cells. These phenomena can be used to help reduce the amount of data required to govern the X-masking process, and thus to control the scan chain selector. In this section, exemplary methods of grouping several test responses into a single item are introduced. The actual compressed gating signals, shared then by the same test responses, can be obtained using the grouped version of the test responses. As a result, the number of masking patterns can be much smaller than the number of original test responses. One embodiment of the grouping method proceeds as follows:

The test responses (e.g., all test responses) are superposed to produce an X-histogram. The entries of the X-histogram can correspond to scan cells and indicate how many times an X reaches a given scan location through the entire test. Typically X states propagate to certain areas of scan only. Such information can be used to rank scan cells, and to guide their selection as observation points, as shown in the remaining of this section.

In certain embodiments, the method of selecting scan cells as observation points uses an additional D-histogram whose entries, like the X-histogram data, correspond to successive scan cells. For example, the entry $D_c$ can keep track of the number of faults as they are added to those observed at a scan cell c. With these histograms, and in one particular implementation, ranking scan cells is a straightforward task—the lower the number of X states and the higher the number of errors captured, the higher rank of the cell. Such an approach forces the selection method to prefer scan cells already chosen as propagation sites for other faults, and having low X-state counts. It is also worth noting that choosing, as an observation point, a scan cell that captures lots of X states at other occasions precludes grouping such a response with others that feature X states on the same position, and thus should be avoided.

In one exemplary implementation, the following grouping technique is used for one or more of the faults (e.g., for each fault): selecting, among the fault's propagation sites, the highest-rank scan cell, say C, since it suffices to observe a given fault once; updating the D-histogram accordingly by decreasing entries corresponding to all scan cells where faults observed at scan cell C are visible as well; assigning the selected scan cell C to the first test response where the fault is observed; and removing faults observed at scan cell C from the list.

As a result, each original test response is mapped to a pattern that, in addition to X states, contains a small number of designated fault propagation sites which capture relatively large number of errors. This embodiment uses a single scan through the fault list because it is faster and more compact (but yields virtually the same results as) a method which handles every scan cell individually with tens of thousands of faults propagating to it. Other embodiments of the disclosed technology, however, use different approaches that do not involve a single scan through the fault list.

Once the error-capturing scan cells are determined, and according to one exemplary embodiment, test response cubes are created in which bits corresponding to scan cells hosting X states and those designated as observation points receive the masking values of 0 and 1, respectively. The remaining bits (e.g., all remaining bits) assume a "don't care" status. The test response cubes now become the subject of merging. Merging enables the reduction of patterns used to observe designated scan cells and to mask all X states (in other words, merging helps to reduce the amount of X-masking data).

In one embodiment, the test response cubes are processed as follows. In principle, this exemplary embodiment tries to merge compatible cubes to form a single pattern. Cubes are compatible if in every position where one of the cubes has a value of 0 or 1, the other cubes either feature the same value or a "don't care" value. The exemplary merging method maintains a finite length queue of cubes to limit the number of cubes that can be merged at the same time. The queue-maintenance operations involve comparisons among items on the queue, and thus the queue's size determines the complexity of the cube merging. Controlling the queue size allows one to trade off the number of final patterns and processing time. Once the cubes in the queue have been examined (and possibly merged), the cubes already combined together can be discarded, and (if possible) new cubes added to those that still reside on the queue.

One consideration during the merging process is the selection of the cube to add next to those merged earlier. A simple "greedy" algorithm can be used to find a sequence of cubes susceptible for effective merging. For instance, in one exemplary implementation, the process uses the degree of compatibility between two cubes. Given a pair of compatible cubes x and y, we can determine the number $C_{x,y}$ of common positions where both cubes feature 0s or 1s. Let also $S_x$ and $S_y$ be the total number of specified locations in cubes x and y, respectively. The degree of their compatibility can be given by the ratio:

$$W_{x,y} = C_{x,y}/\min\{S_x, S_y\}, \ W_{x,y} \in \langle 0, 1 \rangle.$$

Given test response cubes gathered in the queue, one exemplary embodiment begins by assigning its first element to the current result r of merging; then in each iteration, while there are cubes not examined yet, the final masking pattern is created one cube at a time, selecting next the cube c that gives the largest value of $W_{r,c}$. In particular, if cube r contains all specified bits of x, then $W_{r,x}=1.0$, and cube x is the best candidate for merging. As can be seen, the closer a given cube is to the current result in terms of compatibility between their specified patterns, the more beneficial it is to merge them as the number of specified bits in the resultant cube increases at a reasonable pace. Consequently, such a cube is more likely to be encoded.

Cube merging can be followed by an encoding step. Successful compression of patterns produced by the above exemplary merging procedure makes it possible to finally accept such groupings. A detailed description of this phase is presented in the following sections.

Selection Logic

As shown in the previous section, certain embodiments of the disclosed technology exploit the fact that test responses feature a large number of clustered unknown states and that it suffices to observe a relatively small number of positions that capture the significant portion of actual errors.

Having a large number of X states occurring in contiguous and adjacent areas of scan chains makes it possible to deliver the identical mask data to gating circuitry for a number of shift cycles. In order to implement this delivery, however, a mechanism to sustain the outputs of the selector for more than a single clock cycle is desired. The mechanism also desirably allows the selector to change its internal state to ensure successful encoding of the next desired mask bits.

Figure 3:
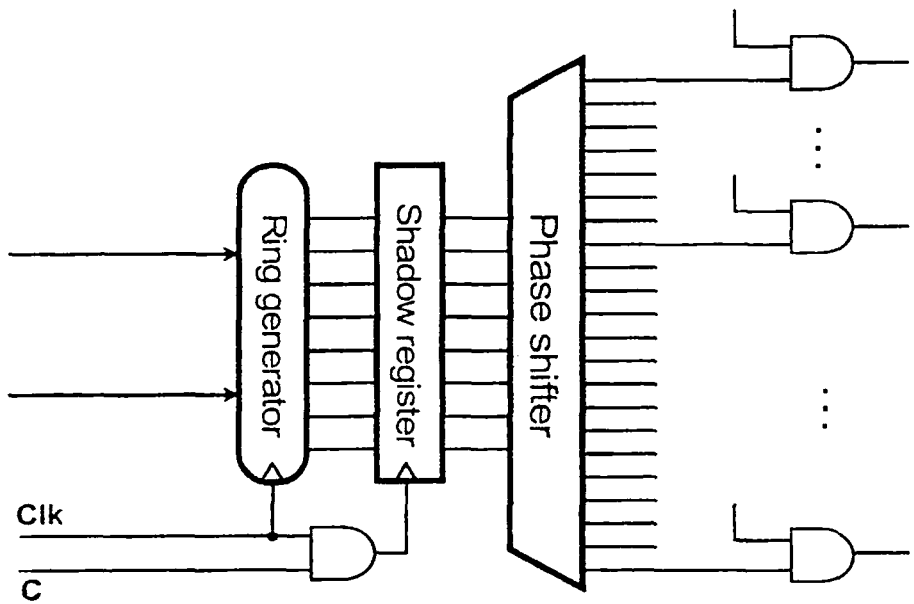
FIGS. 3-5 illustrate examples of selection logic that may be implemented according to various examples of the invention.

In one exemplary embodiment, the selection logic is a sequential circuit that comprises a ring generator (or another linear finite state machine), a shadow register, and a phase shifter. An example of such selection logic is shown in FIG. 3. Examples of ring generators are described in U.S. Pat. No. 6,353,842 and G. Mrugalski et al, "Ring generators—new devices for embedded test applications," *IEEE Trans. CAD*, vol. 23, pp. 1306-1320, September 2004, which are hereby incorporated herein by reference. In the illustrated embodiment, compressed mask data can be delivered through c inputs in a continuous manner, i.e., a new c-bit word is injected into the ring generator every scan shift cycle, effectively moving the selector from one of its states to another. As can be seen, the same mask data can be provided to the AND gates for a number of shift cycles through a shadow register, which captures and saves, for a number of cycles, a desired state of the ring generator while the generator itself keeps advancing to the next state needed to encode another group of bits (representing both Xs and Ds). As a result, independent operations of the ring generator and its shadow register allow virtually any state which causes no conflicts with targeted bits to mask all X states while ensuring high observability of errors.

In principle, an extra input C can facilitate the operation of the shadow register. This is illustrated in FIG. 3. Every shift cycle (or, in some embodiments, for every fixed number of cycles), a control bit can be delivered to the selector in order to indicate whether the shadow register should be reloaded with the current content of the ring generator. If a given control bit is set at 1, then the shadow register updates its state before the ring generator reaches its next state.

Figure 4:
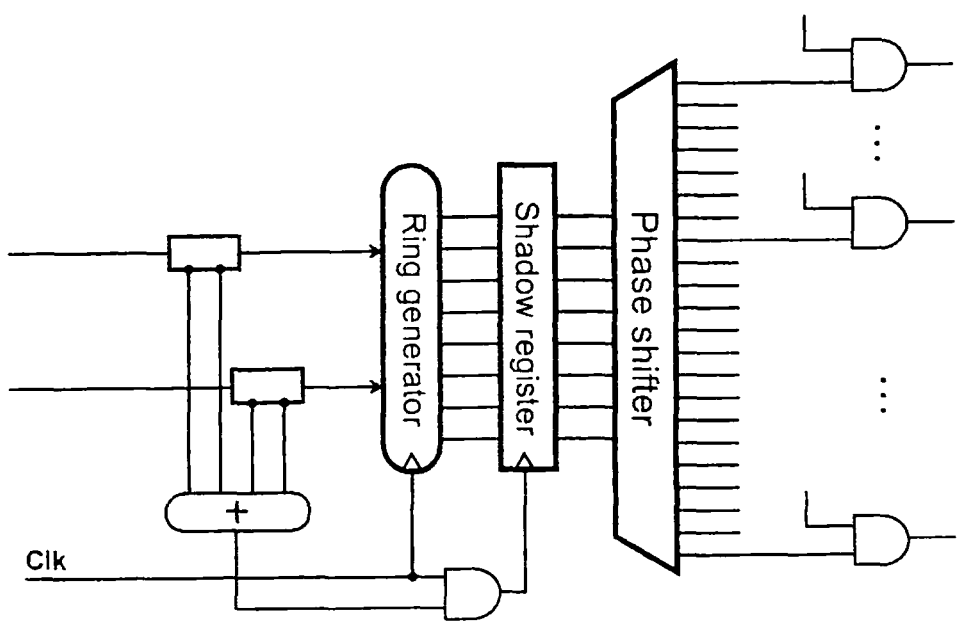

In other embodiments, instead of using an extra input, the control information can be merged with the mask variables by reusing data stored in the mask memory. An example of circuitry configured to implement this approach is shown in FIG. 4. Although they still feed the ring generator, mask bits go through the small buffers and then drive an XOR tree, which computes a parity signal for the corresponding input variables. If the parity of these input variables is odd, then, in this example, the shadow register is reloaded before new variables enter the ring generator. Otherwise, the content of the register remains unchanged. It is worth noting that this technique allows one to use even a single input if encoding capabilities of the selector permit. Driving the shadow register and the selector with the same test data requires a special encoding process, an example of which is shown in the following section.

Figure 5:
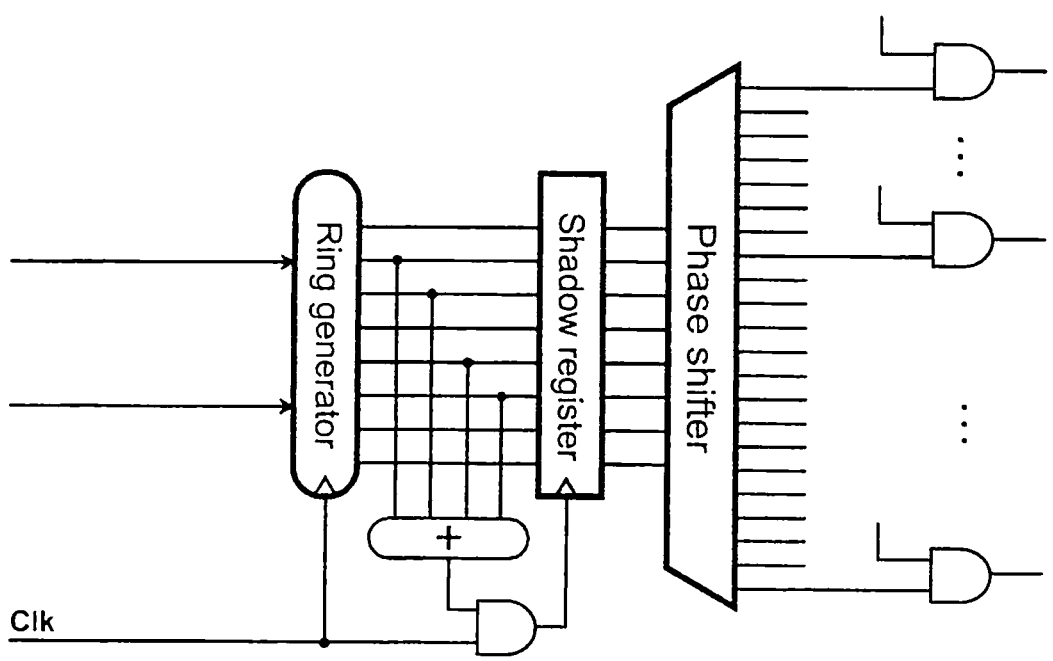

Yet another embodiment of the selection logic is shown in FIG. 5. In this particular embodiment, an XOR tree, used to reload the shadow register, is driven directly from the outputs of the ring generator. This technique can be contrasted with the scheme of FIG. 4, which allows one to control the shadow register by reusing virtually all test data injected in earlier cycles into the generator.

In the absence of X states, it can be highly beneficial to observe all scan chains. This feature can be implemented in various ways. One of the most straightforward rests on the observation that phase shifters are typically designed in such a way that all their outputs are obtained by XOR-ing an odd number of inputs. Hence, if all ring generator bits (or alternatively the corresponding bits of the shadow register) are set to 1, then all gating signals equal 1 as well, and consequently all scan chains can be observed.

Selector Operation

In order to suppress X states (e.g., all X states) and maintain high observability of other scan cells, the selector is desirably operated with mask data generated from a mask data compression procedure. In one exemplary mask data compression procedure, gating signals (e.g., all gating signals) are represented by linear functions of Boolean mask variables injected into the selector. In principle, the procedure partitions a given test response into several blocks comprising a certain number of consecutive slices such that there are no scan chains that capture both X's and D's at the same time inside the blocks. This feature allows one to repeat a given selector state many times in succession by using the shadow register storing a state that the ring generator entered at the beginning of a block. As a result, one can successfully encode lots of identical data, such as clustered X states or multiple errors. By contrast, traditional test cube compression schemes typically require one equation for every specified bit. The same observation applies equally to reseeding-based X-masking schemes, such as those described in M. Naruse, I. Pomeranz, S. M. Reddy, and S. Kundu, "On-chip compression of output responses with unknown values using LFSR reseeding," *Proc. ITC*, pp. 1060-1068, 2003; E. H. Volkerink and S. Mitra, "Response compaction with any number of unknowns using a new LFSR architecture," *Proc. DAC*, pp. 117-122, 2005.

In embodiments of the disclosed technology, the actual block size is also determined by the ability of a given selector to encode data captured within boundaries of the block. In certain embodiments of the technology, the encoding process begins with a block and the corresponding state of a ring generator which should be applied first, and gradually moves towards the end of a test response. As long as the mask data can be encoded, the encoding process works by repeatedly increasing the size of the block, and by creating a new set of equations. At some point, a solution may not exist anymore. This particular time frame can then be assigned a new block, and the procedure continued. As a result, a set of blocks that covers the entire test response can be generated.

As an example, consider a 2-input, 12-bit selector using the primitive polynomial $x^{12}+x^{10}+x^5+x^4+1$ and gating 16 scan chains through a phase shifter having the following outputs:

$$s_0 \oplus s_5 \oplus s_6, s_4 \oplus s_7 \oplus s_{10}, s_1 \oplus s_9 \oplus s_{11}, s_0 \oplus s_9 \oplus s_{11},$$

$$s_1 \oplus s_3 \oplus s_5, s_4 \oplus s_6 \oplus s_7, s_3 \oplus s_8 \oplus s_{10}, s_1 \oplus s_9 \oplus s_{10},$$

$$s_4 \oplus s_6 \oplus s_{11}, s_0 \oplus s_3 \oplus s_5, s_0 \oplus s_1 \oplus s_8, s_6 \oplus s_{10} \oplus s_{11},$$

$$s_2 \oplus s_3 \oplus s_5, s_2 \oplus s_7 \oplus s_9, s_2 \oplus s_4 \oplus s_8, s_3 \oplus s_4 \oplus s_5.$$

Consider a shadow register that is controlled by a 4-input XOR gate whose inputs always comprise the last two variables injected through each input of the ring generator (see, e.g., FIG. 4). Suppose the selector is to generate a mask pattern for a test response shown in Table 1 ("-" denotes here the "don't care" positions; bits that should be considered first are located on the right).

TABLE 1

```
- DDDDDDDD- - - - D- D- - - DD- D- - D- - - - - -
- - - DDDD- - DD- - DDDDDD- - - D- D- DD- - - -
- - DD- DDDDD- - - D- - D- DDD- - D- - - - - - - -
- - - - - - - - - - - - - - - - XXXXXXXXDDDD- DD
- - - - - - - - - - - - - - - - - - - - - - - - - - - - - - - -
XXX- X- - XX- XXX- XXXXX- - - - - - - - - - - - -
- - - - - - - - - - - - - - - - - - - - - - - - - - - - - - - -
- - - D- - DD- DDD- - DDDD- DD- - D- D- DDD- -
- - DDDDDDDDDDD- D- - DDD- D- - - - - - - - -
- - - - - - - - - - - - - - - - - - - - - - - - - - - - - - - -
- - - - - - - - - - - - - - - - - - - - - - - - - - - - - - - -
D- DDD- - XXXXXXXX- - - - - - XX- - - XXXXXX
XXXXXX- X- XXXXXXXX- - XXXXX- XXXXXXX
- - - - - - - - - - - - - - - - - - - - - - - - - - - - - - - -
XXXXX- - - - - - - - - - - - - XXXX- - - - - - - - - -
- - - - - - - - - - - - - - - - - - - - - - - - - - - - - - - -
```

The mask variables $a_0, b_0, a_1, b_1 \ldots$, are provided in pairs. Hence, continuous operation of the selector yields the following linear expressions corresponding to locations in the rightmost column (it is assumed that the selector's initial period takes four clock cycles; recall also that X's and D's are represented by the gating values of 0 and 1, respectively):

$$a_2, b_2, a_4 = 1$$

$$a_2, a_3, a_4, b_2, b_3, b_5 = 0$$

$a_1, b_1, b_5 = 0$ $a_6, b_6, a_7, b_7 = 1$

The first three equations correspond directly to one D and two X states of the rightmost slice, while the last one represents a request to store the content of the ring generator in the shadow register before variables $a_6, b_6, a_7, b_7$ will change the state of the generator during the seventh cycle. As can be verified, the above set of equations has a solution that may determine the remaining gating signals, as well. It is now desirable to use the same signals to cover as many following slices as possible. Such a technique gives the ring generator enough time to compensate for fading encoding effectiveness by collecting new mask variables which, in turn, facilitate successful compression during next steps once the shadow register has to be reloaded.

In this example, the next slice does not pose any encoding problems as it features two X states and one D state, each with locations identical to that of the previous slice. Consequently, the only new equation that has to be added to the former set takes care of the shadow register. Since there is no need to reload it, it assumes the form $a_7, b_7 + a_8, b_8 = 0$.

The next slice of interest features two X states and one error. Note that only the D state (represented by the gating signal that must be set to 1) needs an equation. The unknown states are located in the same chains as four earlier unknown states. This particular equation is desirably expressed in terms of variables injected until the sixth cycle, only. This is because a ring generator state which is to cover the indicated symbols should be completely determined before it is moved to the shadow register during the seventh cycle, i.e., when the selector starts gating the scan chains. Hence, by moving conceptually this particular symbol to the beginning of the block, the equation having the following form can be generated: $a_6, a_9, b_6, b_9 = 1$. This equation is further accompanied by the control equation $a_9, a_{10}, b_9, b_{10} = 0$, which indicates no need to reload the shadow register.

After four slices in which equations are generated in this same fashion, the eighth time frame has a conflict with the previous slices and therefore begins a new cluster with the shadow register reloaded. The same scenario applies whenever it is impossible to encode a given slice. Note that the remaining slices (all remaining slices) of the previous cluster receive the control equations similar to the one shown above.

The exemplary process described above yields the sequence of the following mask bits:
0000001001011010000000000000101011000
00001101101001011111111100000100010000
which, when provided to the selector, will produce successive gating signals. The corresponding pattern of such signals for the test cube presented earlier in Table 1 is shown in Table 2. As can be seen, all X states are masked (such 0s are printed in bold in Table 2). The same rule applies to all observation points (bold 1s in Table 2).

```
1 1 1 1 1 1 1 1 1 1 1 1 1 1 1 1 1 1 1 1 1 1 1 1 1 1 1 1 1 1 1 1
1 1 1 1 1 1 1 1 1 1 1 1 1 1 1 1 1 1 1 1 1 1 1 1 1 1 1 1 1 1 1 1
1 1 1 1 1 1 1 1 1 1 1 1 1 1 1 1 1 1 1 1 1 1 1 1 1 1 1 1 1 1 1 1
1 1 1 1 1 0 0 0 0 0 0 0 0 0 0 0 0 0 0 0 0 0 0 0 0 0 1 1 1 1 1 1
1 1 1 1 1 1 1 1 1 1 1 1 1 1 1 1 1 1 1 1 1 1 1 1 1 1 1 1 1 1 1 1
0 0 0 0 0 0 0 0 0 0 0 0 0 0 0 0 0 0 0 0 0 0 0 0 0 0 0 0 0 0 0 0
1 1 1 1 1 0 0 0 0 0 0 0 0 0 0 0 0 0 0 0 0 0 0 0 0 0 0 0 0 0 0 0
1 1 1 1 1 1 1 1 1 1 1 1 1 1 1 1 1 1 1 1 1 1 1 1 1 1 1 1 1 1 1 1
1 1 1 1 1 1 1 1 1 1 1 1 1 1 1 1 1 1 1 1 1 1 1 1 1 1 1 1 1 1 1 1
1 1 1 1 1 0 0 0 0 0 0 0 0 0 0 0 0 0 0 0 0 0 0 0 0 0 1 1 1 1 1 1
0 0 0 0 0 1 1 1 1 1 1 1 1 1 1 1 1 1 1 1 1 1 1 1 1 1 1 1 1 1 1 1
```

-continued

```
1 1 1 1 1 0 0 0 0 0 0 0 0 0 0 0 0 0 0 0 0 0 0 0 0 0 0 0 0 0 0 0
0 0 0 0 0 0 0 0 0 0 0 0 0 0 0 0 0 0 0 0 0 0 0 0 0 0 0 0 0 0 0 0
1 1 1 1 1 1 1 1 1 1 1 1 1 1 1 1 1 1 1 1 1 1 1 1 1 1 1 1 1 1 1 1
0 0 0 0 0 0 0 0 0 0 0 0 0 0 0 0 0 0 0 0 0 0 0 0 0 0 0 0 0 0 0 0
0 0 0 0 0 0 0 0 0 0 0 0 0 0 0 0 0 0 0 0 0 0 0 0 0 1 1 1 1 1 1 1
```

Multi-Masking

The final X-masking patterns produced by embodiments of the cube merging procedure described above inherently feature high fill rates. This is because the scan chain selector not only suppresses X states, but is supposed to help achieve the highest possible observability of the remaining scan cells as well. Although the exemplary encoding technique presented above addresses specifically this type of pattern, it may fail when trying to encode some of the most demanding cases. When the encoding technique fails, the original X-masking pattern can be relaxed by splitting it into two or more patterns having lower fill rates with respect to scan cells that capture errors (locations corresponding to the X states must be kept in all patterns). Such relaxed patterns are then used to mask the X states multiple times while repeatedly observing different sets of scan cells of the same test response. In order to generate the relaxed masking patterns, an exemplary embodiment of the encoding procedure proceeds as follows:

The masking pattern is initialized with X states, and in one particular implementation is initialized with all X states (in certain embodiments, this corresponds to putting 0s in all relevant locations). Next, as long as this pattern can be compressed, the procedure iteratively attempts to pack more specified bits representing fault propagation sites (that is 1s) into that pattern in a manner that allows for successful encoding. Selection of these specified bits is flexible and can be done in a variety of ways, but should desirably be performed so that a given scan cell can be observed. By contrast, with conventional test data compression schemes, specified bits can only be added in accordance with successive test cubes generated by ATPG.

Let D be a set that initially contains all specified bits representing fault propagation sites in the original response that the encoding procedure initially failed to encode. Let also $d = |D|$. According to one exemplary implementation, the relaxation process is as follows. $d/2$ specified bits are selected (e.g., randomly or according to some non-random pattern) from D (in other embodiments, other fractional amounts of D are selected.) An attempt is made to encode the selected bits. If the attempt succeeds, these items are removed from D. The variable d assumes now the value of $d/2$ (or other appropriate fractional value), and the procedure continues to select (e.g., randomly) another group of d specified bits still in D, which it subsequently tries to encode. Note that the procedure proceeds further even in the case of encoding failure, as the procedure will try to add another (but twice smaller) group of bits that could be encoded. The entire procedure stops when $d < 1$. If the original content of D has not been changed at all, then this condition makes the procedure declare an actual encoding failure.

Once the resultant masking pattern is obtained, the selection logic can be simulated as being driven by that vector to determine points observed as by-products. The use of linear selection logic typically implies visibility of half of the scan cells. Thus, one may expect that some additional fault propagation sites, not targeted by a given masking pattern, can be observed as well. These fortuitously determined locations are desirably not to be taken into account when creating another masking pattern for the same response, and thus they are removed from D. The whole relaxation process finishes once the set D becomes empty. It is worth noting that the number of masking patterns derived from a single test response cube (after merging) is very small since, in the worst case, each masking pattern reduces approximately the number of observation points that remain to be observed by half in a logarithmic fashion.

Experimental Results

An embodiment of the scan chain selection logic introduced above was tested on several industrial designs. Their characteristics are presented in Table I. For each circuit, the table gives the following information:
- the number of gates and a scan architecture,
- the total number of faults targeted by ATPG,
- the total number of X states captured by scan cells when applying successive test patterns,
- the number of test responses,
- the number of inputs driving selection logic,
- the size of a ring generator.

TABLE 3

| Design | Gates  | Faults    | X's       | Responses | Merge | Scan      | Inputs | Ring | Split | X rate [%] | D rate [%] | Observe [%] |
|--------|--------|-----------|-----------|-----------|-------|-----------|--------|------|-------|------------|------------|-------------|
| D1     | 220K   | 179,026   | 124,949   | 672       | 2     | 100 × 126 | 2      | 32   | 5     | 2.63       | 18.28      | 53.26       |
|        |        |           |           |           |       | 200 × 63  | 2      | 32   | 9     | 2.59       | 10.15      | 45.97       |
| D2     | 545K   | 795,160   | 26,198    | 1,833     | 11    | 100 × 452 | 2      | 32   | 34    | 0.05       | 11.79      | 62.14       |
|        |        |           |           |           |       | 200 × 226 | 4      | 32   | 37    | 0.05       | 10.84      | 59.60       |
| D3     | 1,095K | 1,263,548 | 15,299    | 5,364     | 14    | 200 × 351 | 2      | 32   | 40    | 0.13       | 7.69       | 57.58       |
|        |        |           |           |           |       | 400 × 176 | 2      | 32   | 55    | 0.12       | 5.59       | 52.90       |
| D4     | 1,147K | 1,973,294 | 503,547   | 1,002     | 45    | 100 × 865 | 4      | 32   | 104   | 3.49       | 5.46       | 54.72       |
|        |        |           |           |           |       | 200 × 433 | 4      | 48   | 146   | 3.68       | 3.89       | 51.26       |
| D5     | 427K   | 417,688   | 2,037,681 | 1,062     | 49    | 40 × 713  | 2      | 48   | 181   | 17.18      | 3.17       | 46.00       |
|        |        |           |           |           |       | 50 × 570  | 4      | 48   | 115   | 17.27      | 4.99       | 52.27       |

In all experiments, a shadow register associated with the ring generator was controlled by XOR logic, as shown in FIG. 4. The other columns report the results obtained by using the exemplary method described above. The column Merge provides the number of test response patterns obtained after completing the response cube merging, as described above. Some merged responses have to be subsequently split (as shown above as well) in order to assure their successful encoding. Consequently, the column Split gives the actual (and final) number of masking patterns which block all X's and guarantees observability of all errors. The columns X rate and D rate summarize the X fill rate and the error fill rate, respectively, as recorded in the masking patterns obtained due to the proposed scheme. The last column Observe provides an average observability of scan cells which do not capture X states. This figure of merit is indicative of likelihood that a fault can be detected even if it propagates to scan cells which are not targeted by the masking scheme. These numbers further confirm the rationale used in the relaxation procedure—many fault propagation sites can be observed as by-products of the masking procedure.

As can be seen, a dramatic reduction of data is achieved in all examined cases despite the high fill rates. Note that the fill rates reported in Table I are the average values; for many response patterns the actual rates can be much higher. It is also worth noting that the amount of data necessary to control selection logic includes information used to assign successive test patterns (responses) to the corresponding masking data. In one solution, successive test patterns can be grouped so that vectors belonging to a given group are served by the same set of masking patterns. As a result, a test controller desirably stores one or more of the following items of information:
- the number of groups,
- the number of test patterns (responses) in each group,
- for each group, the number of masking patterns (obtained after relaxation) and the location of the first masking pattern in the X-masking data memory; note that the number of masking patterns is deployed by the test controller to keep track how many times a given test pattern has to be applied in order to observe all designated fault propagation sites.

As an example, consider design D1 from Table 3 with a scan architecture 100×126. Its 672 test responses can be divided into 2 groups as far as the scan masking is concerned. It appears that the original 2 masking patterns cannot be encoded, and therefore they have been further split into 2 and 3 new patterns, respectively, resulting eventually in 5 different masking patterns. Consequently, the control data amounts in this case to the following numbers: 1 bit to encode the number of groups, 9+9=18 bits to represent quantities of vectors in each group, 2+2=4 bits encoding the number of masking patterns for each group, and finally a certain number of bits that suffice to address memory location of the first masking pattern in each group.

Having illustrated and described the principles of the disclosed technology, it will be apparent to those skilled in the art that the disclosed embodiments can be modified in arrangement and detail without departing from such principles. In view of the many possible embodiments, it will be recognized that the illustrated embodiments include only examples and should not be taken as a limitation on the scope of the disclosed technology. Rather, the disclosed technology includes all novel and nonobvious features and aspects of the various disclosed apparatus, methods, systems, and equivalents thereof, alone and in various combinations and subcombinations with one another.

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

We claim:

1. A circuit, comprising:
   a memory;
   a ring generator, the ring generator being configured to generate and output ring generator output signals, the ring generator output signals being based at least in part on (a) one or more input values applied to the ring generator from the memory and (b) a previous state of the ring generator;

a shadow register, the shadow register being configured to capture the ring generator output signals in response to a shadow register control signal and to generate shadow register output signals;

a phase shifter, the phase shifter being configured to receive the shadow register output signals and to generate phase shifter output signals, the phase shifter output signals comprising phase shifted versions of the shadow register output signals; and one or more gates configured to receive one or more of the phase shifter output signals, the one or more gates being further configured to selectively mask test response values as they are loaded into a compactor based on the one or more of the phase shifter output signals.

2. The circuit of claim 1, further comprising one or more logic gates operable to receive one or more of the input values applied to the ring generator and to produce a signal for selectively controlling when the shadow register control signal is applied to the shadow register.

3. The circuit of claim 1, further comprising one or more logic gates operable to receive one or more of the ring generator output signals and to produce a control signal for selectively controlling when the shadow register control signal is applied to the shadow register.

4. The circuit of claim 1, wherein the shadow register control signal is generated by a gate that selectively gates a clock signal.

5. The circuit of claim 4, wherein the ring generator is clocked by the clock signal.

6. The circuit of claim 1, wherein the phase shifter is configured to sustain one or more of the phase shifter output signals for more than one clock cycle.

7. The circuit of claim 1, wherein the ring generator and the shadow register are configurable to be operated independently of each other.

8. The circuit of claim 1, further comprising an XOR tree configured to control loading of the ring generator and the shadow register based on one or more of the ring generator input values.

9. The circuit of claim 1, further comprising an XOR tree configured to control loading of the shadow register based on one or more of the ring generator output values.

10. One or more non-transitory computer-readable storage media storing design data describing a circuit, the circuit comprising:

a memory;

a ring generator, the ring generator being configured to generate and output ring generator output signals, the ring generator output signals being based at least in part on (a) one or more input values applied to the ring generator from the memory and (b) a previous state of the ring generator;

a shadow register, the shadow register being configured to capture the ring generator output signals in response to a shadow register control signal and to generate shadow register output signals;

a phase shifter, the phase shifter being configured to receive the shadow register output signals and to generate phase shifter output signals, the phase shifter output signals comprising phase shifted versions of the shadow register output signals; and one or more gates configured to receive one or more of the phase shifter output signals, the one or more gates being further configured to selectively mask test response values as they are loaded into a compactor based on the one or more of the phase shifter output signals.

11. The computer-readable storage media of claim 10, wherein the circuit further comprises one or more logic gates operable to receive one or more of the ring generator output signals and to produce a control signal for selectively controlling when the shadow register control signal is applied to the shadow register.

12. The computer-readable storage media of claim 10, wherein the ring generator and the shadow register are configurable to be operated independently of each other.

13. The computer-readable storage media of claim 10, wherein the circuit further comprises an XOR tree configured to control loading of the shadow register based on one or more of the ring generator output values.

14. A method, comprising:

receiving circuit design information representative of a circuit-under-test; and generating selection logic for testing the circuit-under-test, the selection logic comprising:

a memory;

a ring generator, the ring generator being configured to generate and output ring generator output signals, the ring generator output signals being based at least in part on (a) one or more input values applied to the ring generator from the memory and (b) a previous state of the ring generator;

a shadow register, the shadow register being configured to capture the ring generator output signals in response to a shadow register control signal and to generate shadow register output signals;

a phase shifter, the phase shifter being configured to receive the shadow register output signals and to generate phase shifter output signals, the phase shifter output signals comprising phase shifted versions of the shadow register output signals; and one or more gates configured to receive one or more of the phase shifter output signals, the one or more gates being further configured to selectively mask test response values as they are loaded into a compactor based on the one or more of the phase shifter output signals.

15. The method of claim 14, further comprising manufacturing an integrated circuit for the circuit-under-test, the integrated circuit tested at least in part using the generated selection logic.

16. The method of claim 14, further comprising testing the circuit-under-test using the generated selection logic.

17. One or more non-transitory computer-readable storage media storing computer-executable instructions for causing a computer to perform a method, the method comprising:

receiving circuit design information representative of a circuit-under-test; and generating selection logic for testing the circuit-under-test, the selection logic comprising:

a memory;

a ring generator, the ring generator being configured to generate and output ring generator output signals, the ring generator output signals being based at least in part on (a) one or more input values applied to the ring generator from the memory and (b) a previous state of the ring generator;

a shadow register, the shadow register being configured to capture the ring generator output signals in response to a shadow register control signal and to generate shadow register output signals;

a phase shifter, the phase shifter being configured to receive the shadow register output signals and to generate phase shifter output signals, the phase shifter output signals comprising phase shifted versions of the shadow register output signals; and one or more gates configured to receive one or more of the phase shifter output signals, the one or more gates being further configured to selectively mask test response values as they are loaded into a compactor based on the one or more of the phase shifter output signals.

18. The computer-readable storage media of claim 17, wherein the selection logic further comprises one or more logic gates operable to receive one or more of the input values applied to the ring generator and to produce a signal for selectively controlling when the shadow register control signal is applied to the shadow register.

19. The computer-readable storage media of claim 17, wherein the selection logic further comprises one or more logic gates operable to receive one or more of the ring generator output signals and to produce a control signal for selectively controlling when the shadow register control signal is applied to the shadow register.

20. The computer-readable storage media of claim 17, wherein the shadow register control signal is generated by a gate that selectively gates a clock signal.

21. The computer-readable storage media of claim 17, wherein the ring generator is clocked by the clock signal.

22. The computer-readable storage media of claim 17, wherein the phase shifter is configured to sustain one or more of the phase shifter output signals for more than one clock cycle.

23. The computer-readable storage media of claim 17, wherein the ring generator and the shadow register are configurable to be operated independently of each other.

24. The computer-readable storage media of claim 17, wherein the selection logic further comprises an XOR tree configured to control loading of the ring generator and the shadow register based on one or more of the ring generator input values.

25. The computer-readable storage media of claim 17, wherein the selection logic further comprises an XOR tree configured to control loading of the shadow register based on one or more of the ring generator output values.

* * * * *